(12) United States Patent
Alley

(10) Patent No.: US 10,024,884 B2
(45) Date of Patent: Jul. 17, 2018

(54) DYNAMIC MASK TESTING

(71) Applicant: Tektronix, Inc., Beaverton, OR (US)

(72) Inventor: James D. Alley, Newberg, OR (US)

(73) Assignee: Tektronix, Inc., Beaverton, OR (US)

( * ) Notice: Subject to any disclaimer, the term of this patent is extended or adjusted under 35 U.S.C. 154(b) by 653 days.

(21) Appl. No.: 14/285,175

(22) Filed: May 22, 2014

(65) Prior Publication Data

US 2015/0338442 A1    Nov. 26, 2015

(51) Int. Cl.
*G01R 13/02* (2006.01)

(52) U.S. Cl.
CPC .......... *G01R 13/02* (2013.01); *G01R 13/0254* (2013.01)

(58) Field of Classification Search
CPC ... G01R 13/0254; G01R 13/02; G01R 13/345
USPC .............................. 702/57, 66, 67
See application file for complete search history.

(56) References Cited

U.S. PATENT DOCUMENTS

| 5,579,462 | A | 11/1996 | Barber et al. |
| 5,633,997 | A | 5/1997 | Barber et al. |
| 5,760,785 | A | 6/1998 | Barber et al. |
| 6,642,926 | B1 | 11/2003 | Letts |
| 6,728,648 | B1 | 4/2004 | Letts |
| 6,778,931 | B1 | 8/2004 | Letts et al. |
| 7,019,746 | B2 | 3/2006 | Shubert et al. |
| 7,159,187 | B2 | 1/2007 | Bernard et al. |
| 7,652,667 | B2 | 1/2010 | Robinson |
| 7,873,486 | B2 * | 1/2011 | Earls .................. G01R 23/16 324/76.19 |
| 9,170,286 | B2 * | 10/2015 | Bordow ............... G01R 23/18 |
| 2006/0025947 | A1 | 2/2006 | Earls |
| 2014/0142880 | A1 * | 5/2014 | Dobyns ............... G01R 23/165 702/76 |

FOREIGN PATENT DOCUMENTS

EP    2733495 A2    5/2014

OTHER PUBLICATIONS

European Patent Office, Extended European Search Report, dated Nov. 6, 2015, 6 pages, Application No. 15168873.6, Munich, Germany.

* cited by examiner

*Primary Examiner* — An Do
(74) *Attorney, Agent, or Firm* — Marger Johnson; Kevin D. Dothager

(57) ABSTRACT

A device is capable of receiving a waveform and capturing acquisitions of the waveform. Different boundary masks can be applied to the waveform acquisitions, depending on the timing of the acquisition. When a timing interval finishes, a different dynamic boundary mask can be loaded from memory. Boundary masks can include any number of segments, and can be used whenever desired.

19 Claims, 12 Drawing Sheets

M1: (0, 4), (3, 4), (3, 14), (7, 4), (7, 14), (7, 4), (20, 4), (20, 17), (0, 17) | 0.2 s
M2: (0, 4), (3, 4), (3, 14), (7, 4), (7, 14), (7, 4), (20, 4), (20, 17), (0, 17) | 5 acq.
M3: (0, 4), (13, 4), (13, 14), (17, 14), (17, 4), (20, 4), (20, 17), (0, 17) | TE
Initial TE

FIG. 5

| | | | |
|---|---|---|---|
| M1: S1, S4 | 0.2 s | | |
| M2: S2, S4 | 5 acq. | | |
| M3: S3, S4 | TE | | |
| S1: (0, 4), (3, 4), (3, 4), (7, 14), (7, 4), (20, 4), (20, 17), (0, 17) | | | |
| S2: (0, 4), (3, 4), (3, 4), (7, 14), (7, 4), (20, 4), (20, 17), (0, 17) | | | |
| S3: (0, 4), (13, 4), (13, 14), (17, 14), (17, 4), (20, 4), (20, 17), (0, 17) | | | |
| S4: (0, 0), (0, -2), (20, -2), (20, 0) | | | |
| Initial TE | | | |

FIG. 6

DYNAMIC MASK TESTING

FIELD OF THE INVENTION

This invention pertains to waveform analysis, and more particularly to detecting anomalies in waveform acquisitions.

BACKGROUND

Modern oscilloscopes have the ability to detect anomalies in waveforms using a boundary mask. The boundary mask defines an area within which the waveform is expected to reside. This anomaly detection is accomplished on a pixel by pixel basis. If pixels can be identified as violation pixels in a display pixel plane (a boundary mask), when a digitized signals is presented in two dimensions, it can be determined whether the shape is or is not valid. When the waveform crosses the boundary of the mask, an anomaly can be detected, and any desired course of action can be taken: the oscilloscope can pause waveform acquisition, can alert the user, or can take other action, as desired.

But current oscilloscopes only use one boundary mask relative to all waveform acquisitions: the boundary mask has a static shape. That is, the boundary mask represents the limits of all possible waveform acquisitions. While using a single static boundary mask ensures that any violations detected by the oscilloscope are true anomalies, a single static boundary mask also means that some anomalies in the waveform might not be detected using the static boundary mask.

Consider, for example, the waveform acquisitions shown in FIG. 1, which shows two acquisitions of a waveform over time. In acquisition 105, the waveform is generally uniform, except for a peak at frequency 110. In acquisition 115, the waveform is generally uniform, except for a peak at frequency 120. Boundary mask 125 represents a single static boundary mask that determines where anomalies might occur over the entire acquisition of the waveform, and can be applied to both acquisitions 105 and 115.

But if acquisition 105 were to have a peak at frequency 120, this would be an anomaly: a departure from the expected form of the wave at the time of acquisition. Similarly, a peak at frequency 110 in acquisition 115 would be an anomaly. But in each case, because these anomalous peaks might not cross the edge of boundary mask 125, the oscilloscope would not detect the anomaly and take any appropriate action.

SUMMARY OF THE INVENTION

Embodiments of the claimed invention include a system for using dynamic boundary masks. An analog-to-digital converter (ADC) can receive and digitize a waveform, and acquisitions of the waveform can be stored in memory. The memory can also store two or more boundary masks, along with timing information for each boundary mask. A rasterizer can draw acquisitions of the digitized waveform on a display. A processor can be coupled to the memory and the rasterizer, and can signal the rasterizer when to change to a new boundary mask. The processor can determine when the timing interval associated with a boundary mask is over and select another boundary mask to use with further acquisitions of the digitized waveform.

BRIEF DESCRIPTION OF THE DRAWINGS

FIG. 5 shows how dynamic boundary masks can be stored in the memory of FIG. 4, according to one embodiment of the invention.

FIG. 6 shows how dynamic boundary masks can be stored in the memory of FIG. 4, according to another embodiment of the invention.

DETAILED DESCRIPTION

Figure 1:
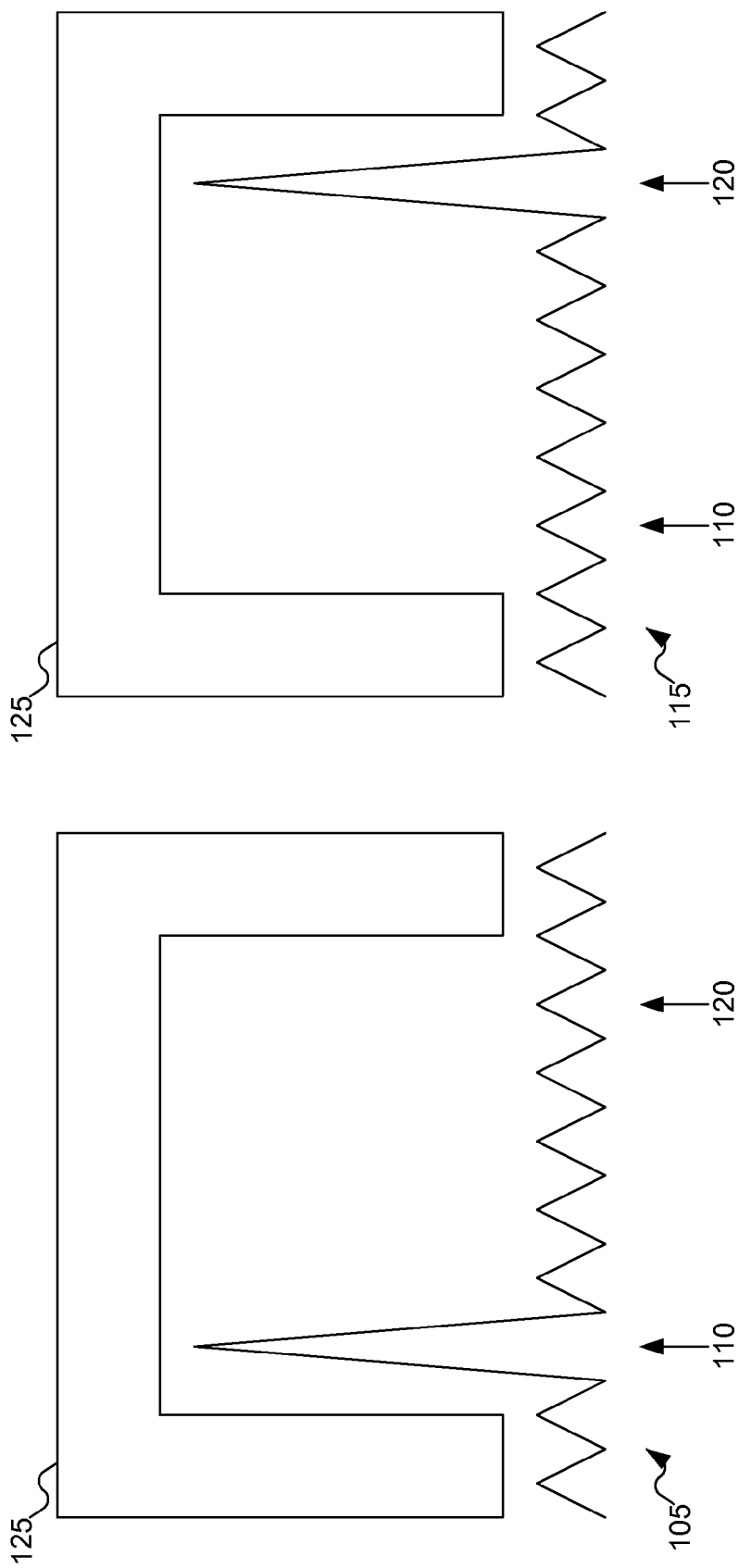
FIG. 1 shows a static boundary mask as used with acquisitions of a waveform in an oscilloscope in the prior art.
Figure 2:
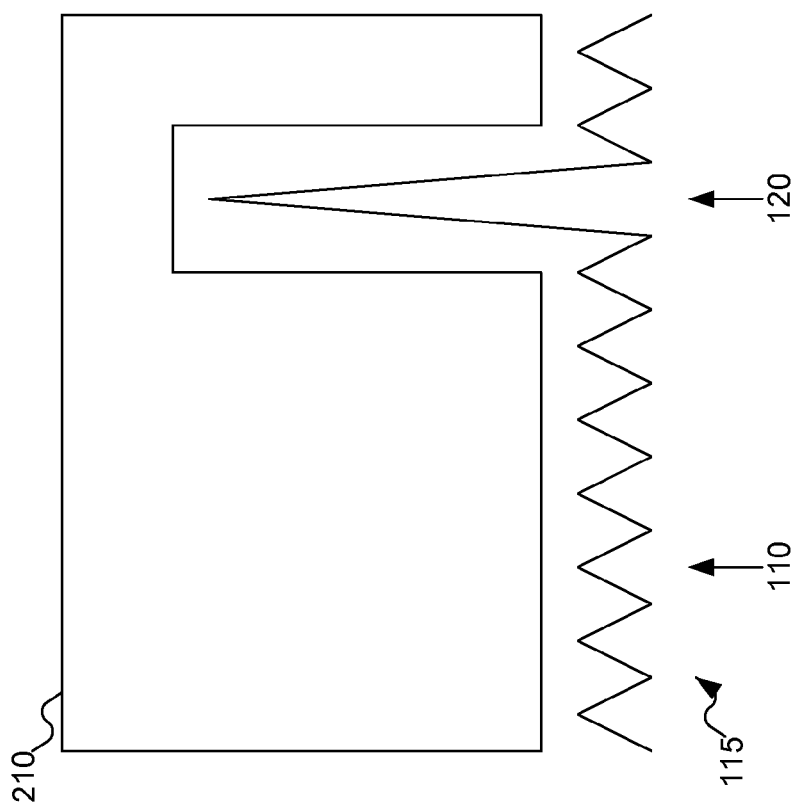
FIG. 2 shows dynamic boundary masks used with the acquisitions of the waveform of FIG. 1.
Figure 2:
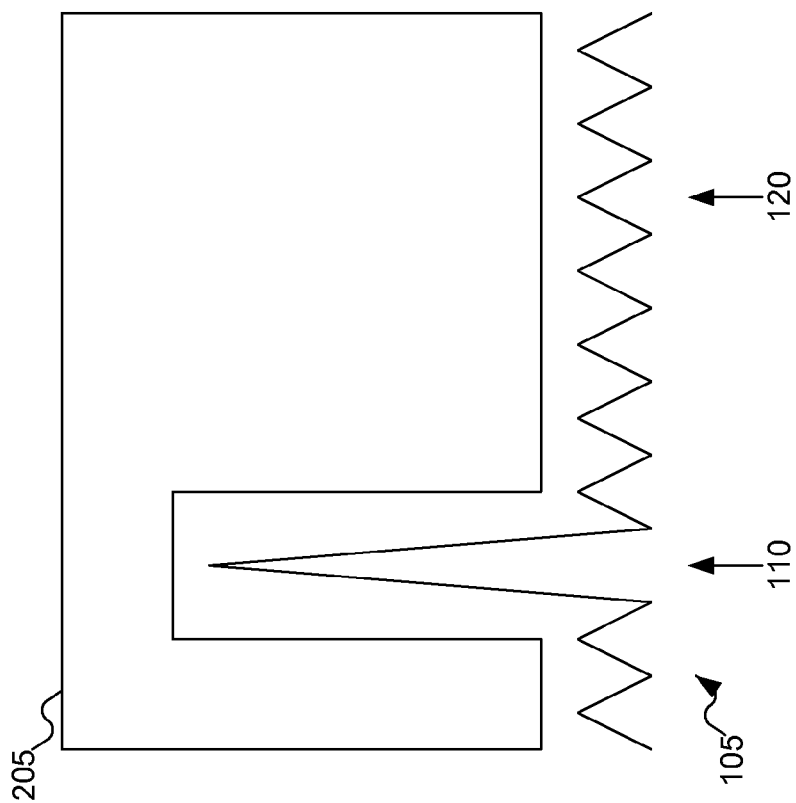

In contrast to FIG. 1, FIG. 2 shows dynamic boundary masks (also called just "masks" herein: the term "masks" is intended to mean the same thing as "boundary mask") used with the acquisitions of the waveform of FIG. 1. In FIG. 2, the same waveform, with the same acquisitions 105 and 115, is shown. But instead of using a single static boundary mask, different boundary masks 205 and 210 are used with acquisitions 105 and 115. For example, boundary mask 205 roughly follows acquisition 105, and boundary mask 210 roughly follows acquisition 115. This means that if frequency 120 were to have a peak in acquisition 105, the peak could be a detected anomaly, because it might violate boundary mask 205. Similarly, if frequency 110 were to have a peak in acquisition 115, the peak could be a detected anomaly, because it might violate boundary mask 210. All of this means that fewer anomalies should be missed by the boundary masks.

FIG. 2 shows two boundary masks 205 and 210. But it should be understood that any number of boundary masks can be used with a given waveform: the only effective limit is the amount of memory in the device that can be used to store boundary masks. Boundary masks, such as boundary masks 205 and 210, are most useful when the expected waveform shape is known relative to time. It is important to know what boundary mask to use relative to any given waveform acquisition. Put another way, it is important that the device performing the waveform analysis can determine when to transition from one boundary mask to another. Therefore, boundary masks 205 and 210 are not necessarily useful when analyzing a random waveform, where the expected waveform shape relative to time is not known.

Figure 3:
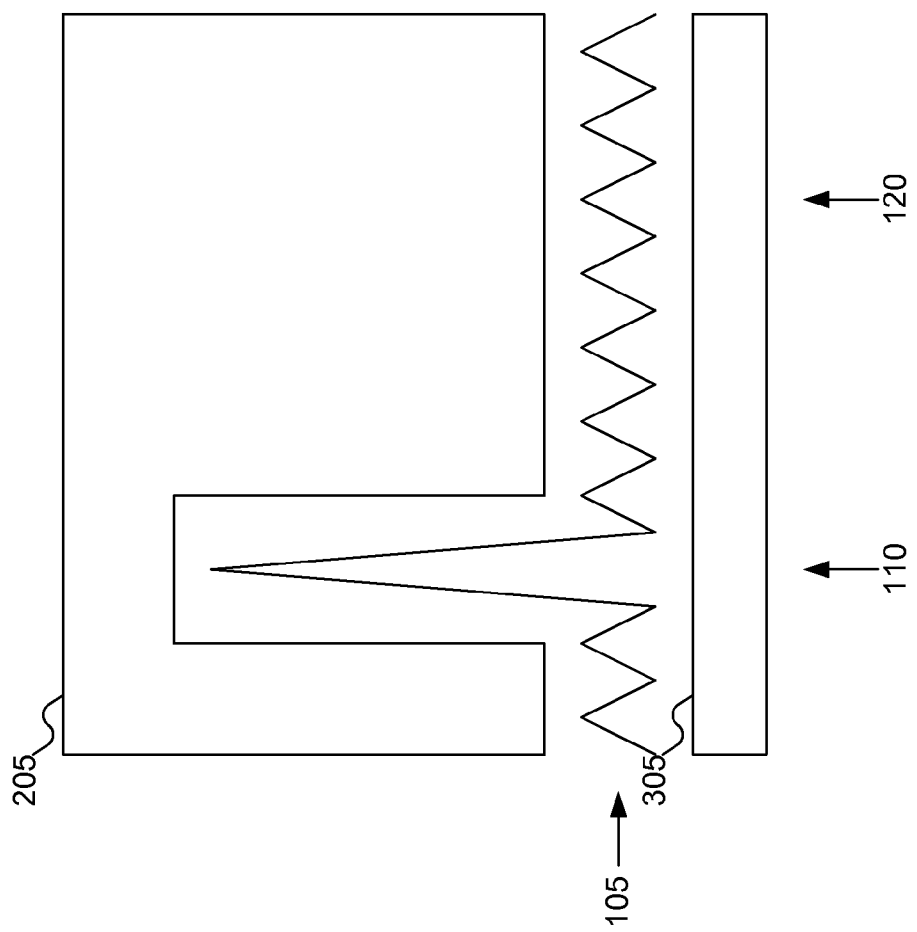
FIG. 3 shows one of the dynamic boundary masks of FIG. 2 including multiple segments.

While FIG. 2 shows the boundary masks used with each acquisition as having one contiguous shape, an individual boundary mask can include multiple segments. For example, FIG. 3 shows one of the dynamic boundary masks of FIG. 2 including multiple segments. In FIG. 3, the boundary mask includes two segments: segment 205 and segment 305. In this manner, multiple boundaries can be applied to a waveform acquisition such as acquisition 105. While FIG. 3 shows only two segments 205 and 305 in the boundary mask, a boundary mask can include any number of segments: for example, seven segments. Furthermore, while segments 205 and 305 have square corners (i.e., 90° corners) and lines that are straight and run parallel to the axes of the waveform, segments could include curved lines, lines that are not parallel to either axis of the graph, and corners that are not square. For the remainder of this document, the term "boundary mask" is intended to describe a boundary mask with any number of segments.

Figure 4:
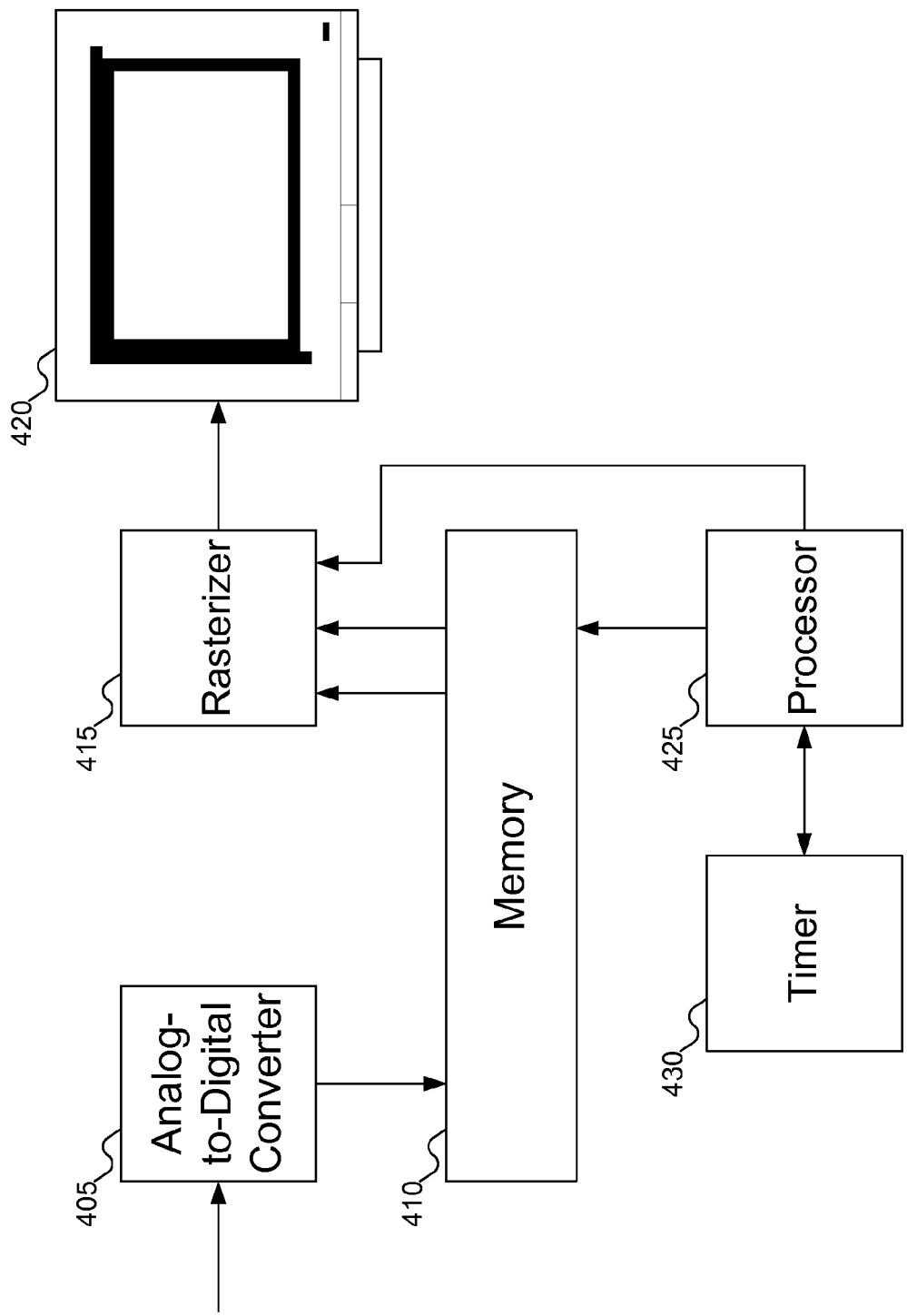
FIG. 4 shows a hardware arrangement to store and utilize dynamic boundary masks as shown in FIGS. 2 and 3, according to an embodiment of the invention.

FIG. 4 shows a hardware arrangement to store and utilize dynamic boundary masks as shown in FIGS. 2 and 3, according to an embodiment of the invention. The hardware arrangement shown in FIG. 4 can be part of any desired device, such as an oscilloscope or a test-and-measurement instrument, among other possibilities. In FIG. 4, analog-to-digital converter (ADC) 405 can acquire a waveform (that is, generate an acquisition of the waveform), and store that acquisition in memory 410. Rasterizer 415 can access an acquisition from memory 410 and display it on display 420. Display 420 can be any type of display, and can be built into the device that includes the other components shown in FIG. 4.

Rasterizer 415 also receives input from processor 425. Processor 425 is responsible for instructing rasterizer 415 as to what boundary mask to use for a particular acquisition of the waveform. The boundary masks can also be stored in memory 410 and accessed therefrom by rasterizer 415. In one embodiment of the invention, processor 425 sends a signal to rasterizer 415 identifying a boundary mask to use for each acquisition. But in another embodiment of the invention, processor 425 determines when the boundary mask should change, and only signals rasterizer 415 when a new boundary mask should be loaded. To that end, processor 425 can use timer 430 to determine when enough "time" has elapsed to change the boundary mask.

The word "time" was put in quotation marks above because it should not be interpreted to mean just an interval of time (e.g., two tenths of a second). "Time" can also mean a number of acquisitions between boundary mask changes, or waiting for a trigger event to occur before changing boundary masks.

FIG. 5 shows how dynamic boundary masks can be stored in the memory of FIG. 4, according to one embodiment of the invention. In FIG. 5, memory 410 is shown as including three boundary masks 505, 510, and 515, each with an associated timing interval 520, 525, and 530. Boundary mask 505 stores the coordinates for boundary mask 205 in FIG. 2, and boundary mask 515 stores the coordinates for boundary mask 215 in FIG. 2 (boundary mask 510 is not shown in the drawings).

Corresponding to each boundary mask is a timing interval, which specifies the amount of "time" the boundary mask is to be used. For example, timing interval 520 specifies that boundary mask 505 is to be used for 0.2 seconds, timing interval 525 specifies that boundary mask 510 is to be used for five waveform acquisitions, and timing interval 530 specifies that boundary mask 515 is to be used until a trigger event occurs. Processor 425 (of FIG. 4) can watch for the trigger event to occur, and can then notify rasterizer 415 to load the next boundary mask.

Returning to FIG. 5, memory 410 can also store identifier associated with each boundary mask. For example, boundary mask 505 includes the identifier M1, boundary mask 510 includes the identifier M2, and boundary mask 515 includes the identifier M3. By using an identifier, processor 425 (of FIG. 4) can specify to rasterizer 415 (of FIG. 4) which boundary mask to load. Alternatively, the boundary masks can be stored in memory 410 in the order in which they are to be loaded, and rasterizer 415 (of FIG. 4) simply loads the boundary masks in sequence, starting with the first boundary mask in memory 410. Or, processor 425 (of FIG. 4) can load the next boundary mask from memory 410 and transmit that boundary mask to rasterizer 415 (of FIG. 4).

Returning to FIG. 5, memory 410 can also store initial trigger event 535. Initial trigger event 535 specifies an event that indicates when boundary masks should start being used. For example, a waveform might have a periodic form, but the acquisitions could begin at any point in the waveform's period. If the boundary masks were used starting with the first acquisition, the boundary masks being used might not be appropriate for the waveform acquisition. By waiting until a trigger event has occurred, the system can be sure that the boundary masks are properly synchronized with the waveform acquisitions. As an example of an initial trigger event, processor 425 (of FIG. 4) can watch for the peak at frequency 110 (in FIG. 2), after which processor 425 (of FIG. 4) can signal rasterizer 415 (of FIG. 4) to start loading boundary masks.

One thing that has not been described yet is what the system should do after the last boundary mask has been used. For example, returning to FIG. 5, assume that boundary masks 505, 510, and 515 are the order in which the boundary masks should be loaded. Once boundary mask 515 has been loaded into rasterizer 415 (of FIG. 4) and timing interval 530 is finished, what should happen? There are several possibilities as to what can occur. In one embodiment of the invention, after the trigger event associated with the last boundary mask has occurred, rasterizer 415 (of FIG. 4) can stop using boundary masks with waveform acquisitions. This embodiment of the invention can be used, for example, when a waveform has a known expected duration, after which no further acquisitions are expected. In another embodiment of the invention, the first boundary mask can be loaded again and used for its associated timing interval. This embodiment of the invention can be used, for example, with waveforms that have an expected period of repetition. In yet another embodiment of the invention, memory 410 can store a final trigger event (not shown). Until the final trigger event occurs, the boundary masks can be used repeatedly, but after the final trigger event occurs, rasterizer 415 (of FIG. 4) can stop using boundary masks. In yet another embodiment, once the use of the last boundary mask is finished, the device can wait for the initial trigger event. This embodiment can be used, for example, in testing parts: when the use of the last boundary mask is finished, the part begin tested can be removed from the device and a new part put in its place. The device can then wait until the initial trigger event occurs to start using the dynamic boundary masks.

FIG. 2 shows how the boundary masks of FIG. 2 can be stored in the memory of FIG. 4. The boundary masks of FIG. 2, as discussed above, include only one segment. FIG. 6 shows how dynamic boundary masks, such as the boundary mask shown in FIG. 3, that include multiple segments can be stored in the memory of FIG. 4, according to another embodiment of the invention. In FIG. 6, boundary masks 605, 610, and 615 include not the coordinates of the boundary masks themselves, but rather identifiers of the segments that make up the boundary masks. For example, boundary mask 605 includes segments 620 and 625, boundary mask 610 includes segments 630 and 625, and boundary mask 615 includes segments 635 and 625. While FIG. 6 shows all three boundary masks as including two segments, it should be understood that a boundary mask can include any number of segments, and that the use of two segments per boundary mask is merely illustrative. Again, processor 425 (of FIG. 4) can signal rasterizer 415 (of FIG. 4) with the identifier of the boundary mask to use, and rasterizer 415 (of FIG. 4) can load the boundary mask, including all of its segments, from memory 410.

One thing that has not been discussed yet is how the boundary masks (including their segments) are stored in memory 410 originally. Of course, a user can manually define the boundary masks and their associated timing intervals, which can then be loaded into memory 410. But it is also possible for the boundary masks to be created automatically. For example, a waveform that is known to be valid (that is, known to have no anomalies) can be input to the device. The user can provide timing intervals to be used, or the device can scan the waveform acquisitions to determine appropriate timing intervals. The device also scans the waveform acquisitions to determine the acceptable limits for the waveform acquisitions over the timing intervals, and can automatically generate the boundary masks based on the determined acceptable limits of the waveform known to be valid. These generated boundary masks can then be stored in the memory of the device.

Figure 7A:
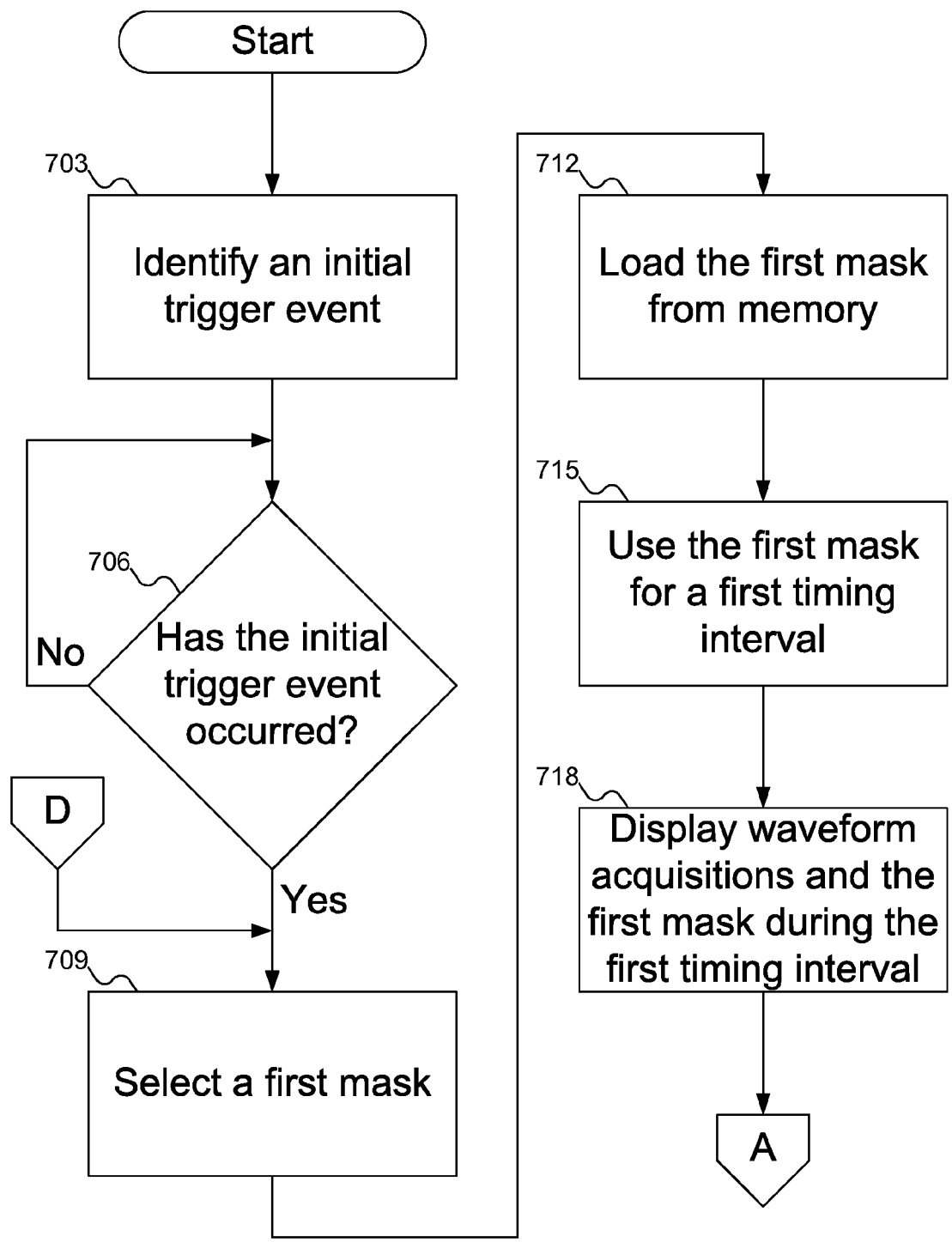
FIGS. 7A-7D show a flowchart of a procedure for using dynamic masks in a device, according to an embodiment of the invention.
Figure 7B:
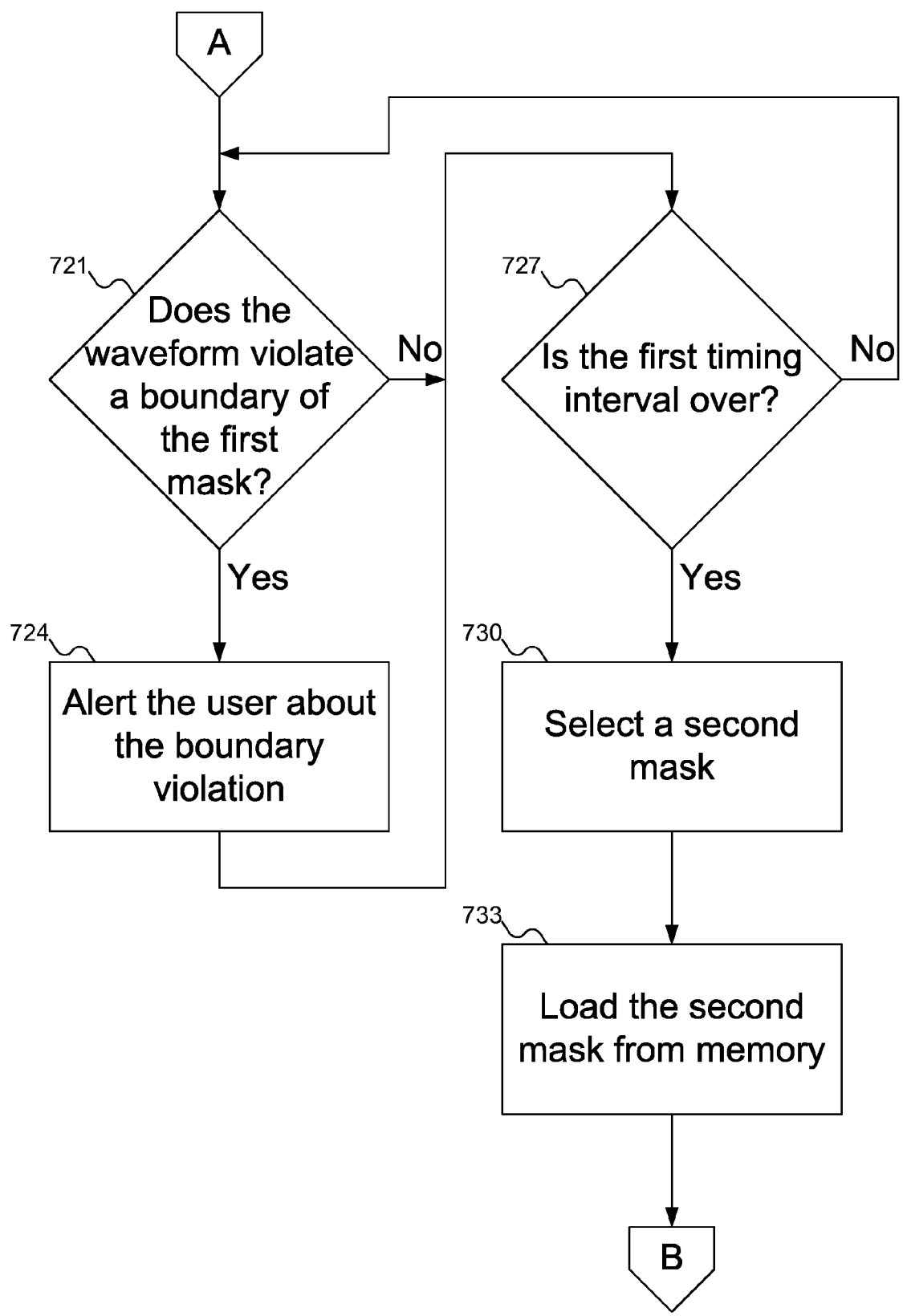
Figure 7C:
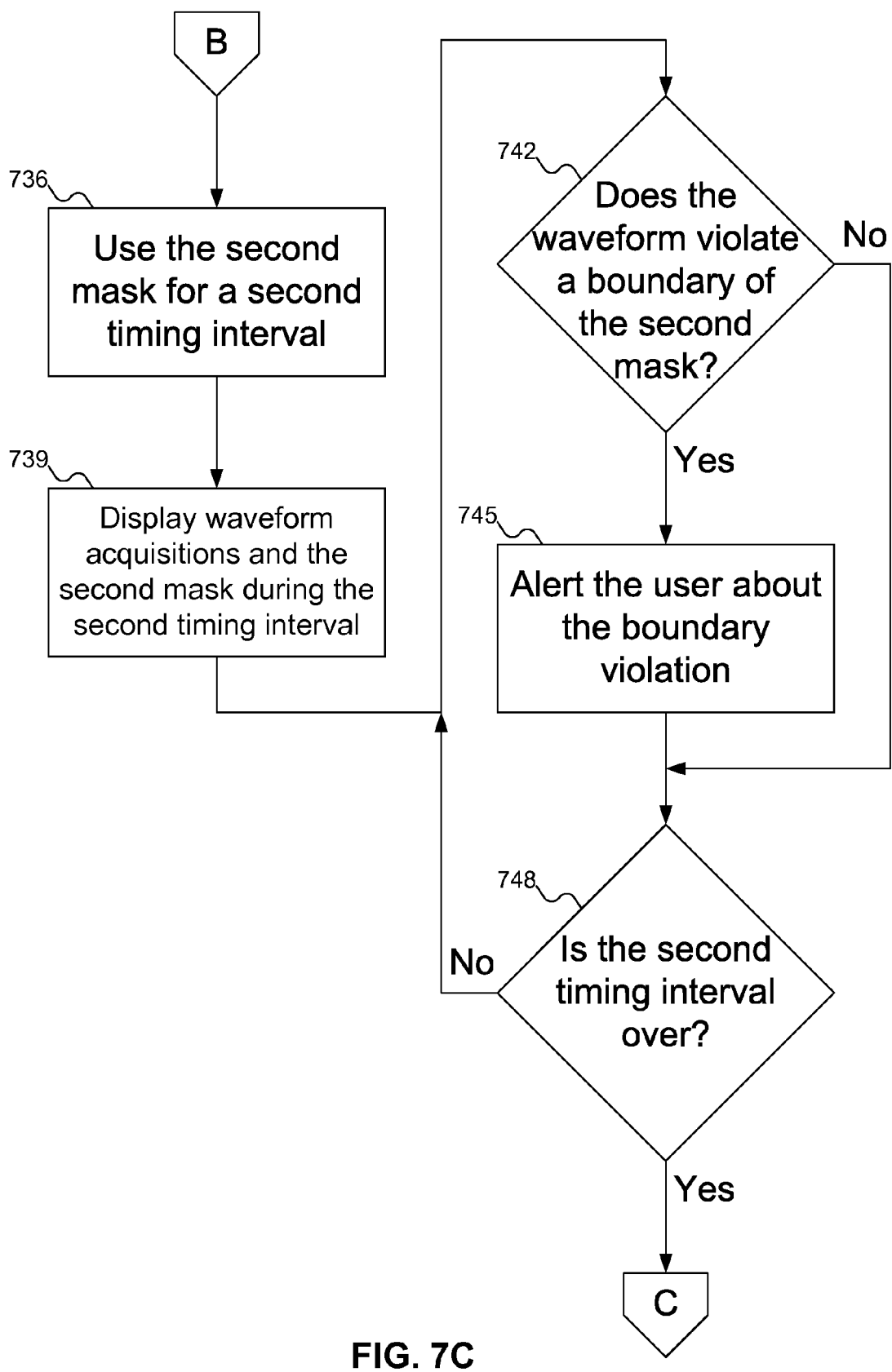
Figure 7D:
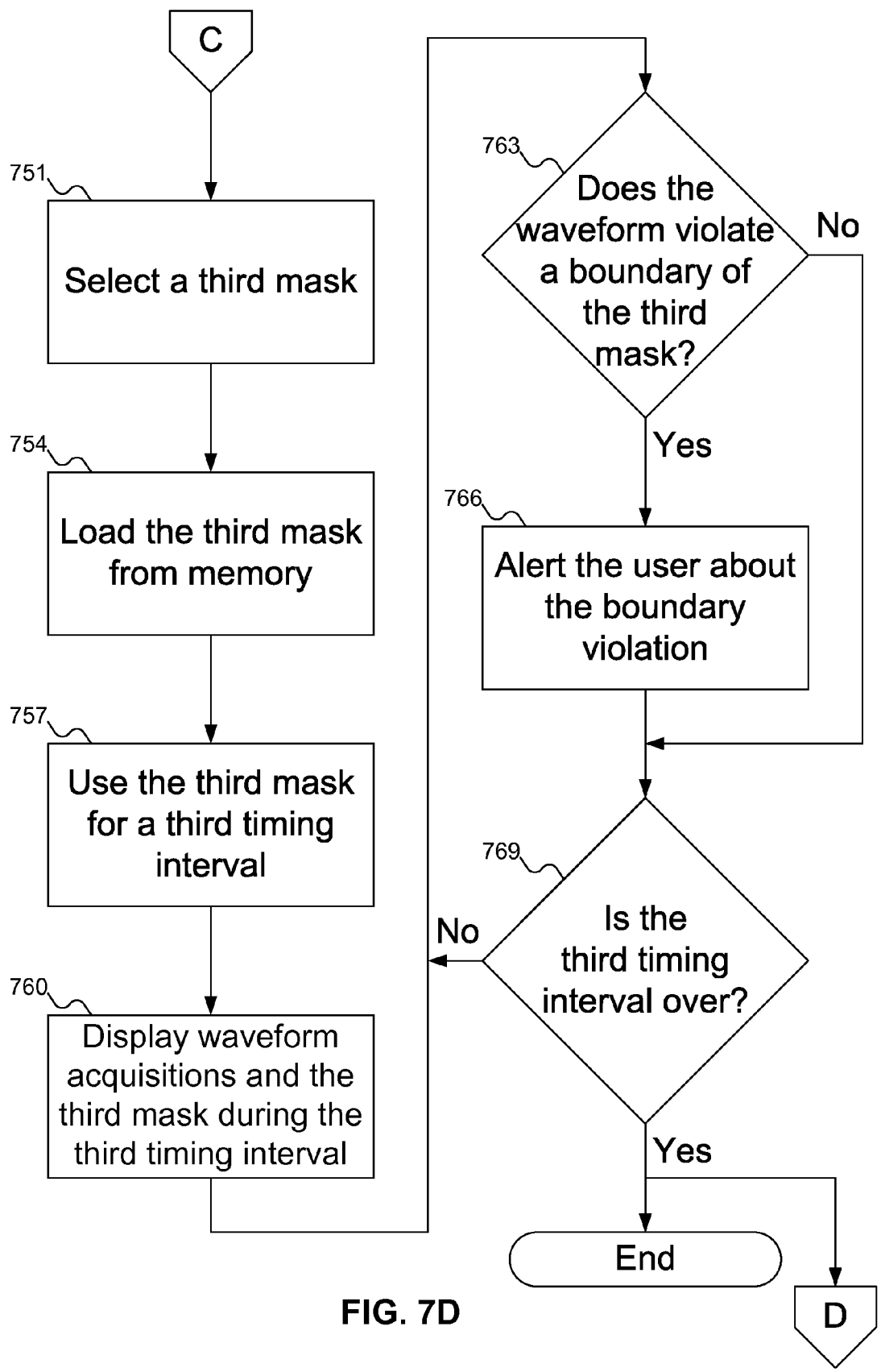

FIGS. 7A-7D show a flowchart of a procedure for using dynamic masks, according to an embodiment of the invention. In FIG. 7A, at block 703, the device identifies an initial trigger event. At block 706, the device waits until the initial trigger event has occurred. Once the initial trigger event has occurred, at block 709 the device selects a first boundary mask. At block 712, the device loads the first boundary mask from memory. At block 715, the device uses the first boundary mask during its associated timing interval. At block 718, the device displays waveform acquisitions and the first boundary mask during the timing interval.

At block 721 (FIG. 7B), the device determines if the waveform violates a boundary of the first boundary mask. If so, then at block 724 the device takes appropriate action, such as alerting the user to the violation anomaly in the waveform acquisition. Regardless of whether or not there was a violation of the boundary mask at block 721, at block 727 the device determines if the timing interval associated with the first boundary mask is over. If not, then control returns to block 721 to continue use of the first boundary mask with another waveform acquisition. But if the first timing interval is over, then at block 730 a second boundary mask is selected, and at block 733 the second boundary mask is loaded from memory.

At block 736 (FIG. 7C), the device uses the second boundary mask during its associated timing interval. At block 739, the device displays waveform acquisitions and the second boundary mask during the timing interval. At block 742, the device determines if the waveform violates a boundary of the second boundary mask. If so, then at block 745 the device takes appropriate action, such as alerting the user to the violation anomaly in the waveform acquisition. Regardless of whether or not there was a violation of the second boundary mask at block 742, at block 748 the device determines if the timing interval associated with the second boundary mask is over. If not, then control returns to block 742 to continue use of the second boundary mask with another waveform acquisition.

If the second timing interval is over, then at block 751 (FIG. 7D) a third boundary mask is selected, and at block 754 the third boundary mask is loaded from memory. At block 757, the device uses the third boundary mask during its associated timing interval. At block 760, the device displays waveform acquisitions and the third boundary mask during the timing interval. At block 763, the device determines if the waveform violates a boundary of the third boundary mask. If so, then at block 766 the device takes appropriate action, such as alerting the user to the violation anomaly in the waveform acquisition. Regardless of whether or not there was a violation of the third boundary mask at block 763, at block 769 the device determines if the timing interval associated with the third boundary mask is over. If not, then control returns to block 763 to continue use of the third boundary mask with another waveform acquisition.

If the third timing interval is over, then there are some options. One possibility is to simply end processing after the third timing interval is over: any remaining acquisitions will then not be subject to boundary mask analysis. Another possibility is to return control to block 709 (FIG. 7A) and restart boundary mask analysis with the first boundary mask. It is also possible to combine these options: for example, the three boundary masks can be used iteratively for some number of iterations, after which boundary mask analysis ends. When to end boundary mask analysis can also be the subject of a trigger event, as described above.

While FIGS. 7A-7D describe operations using three boundary masks, this fact is not intended to be a limitation on any embodiments of the invention. That is, embodiments of the invention can include any number of dynamic boundary masks. The use of three boundary masks in FIGS. 7A-7D is merely illustrative.

Figure 8A:
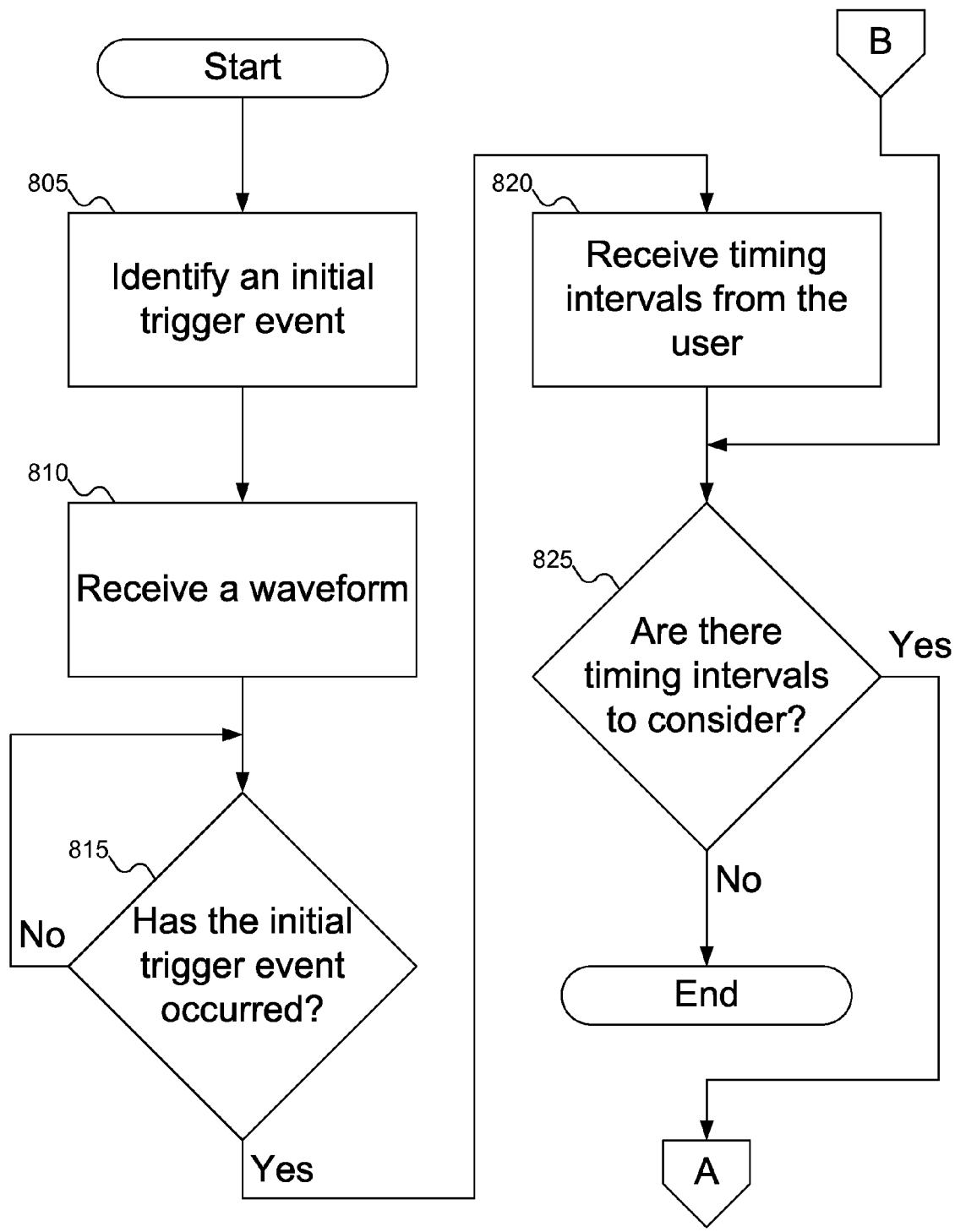
FIGS. 8A-8B show a flowchart of a procedure for generating dynamic masks from a known valid waveform, according to an embodiment of the invention.
Figure 8B:
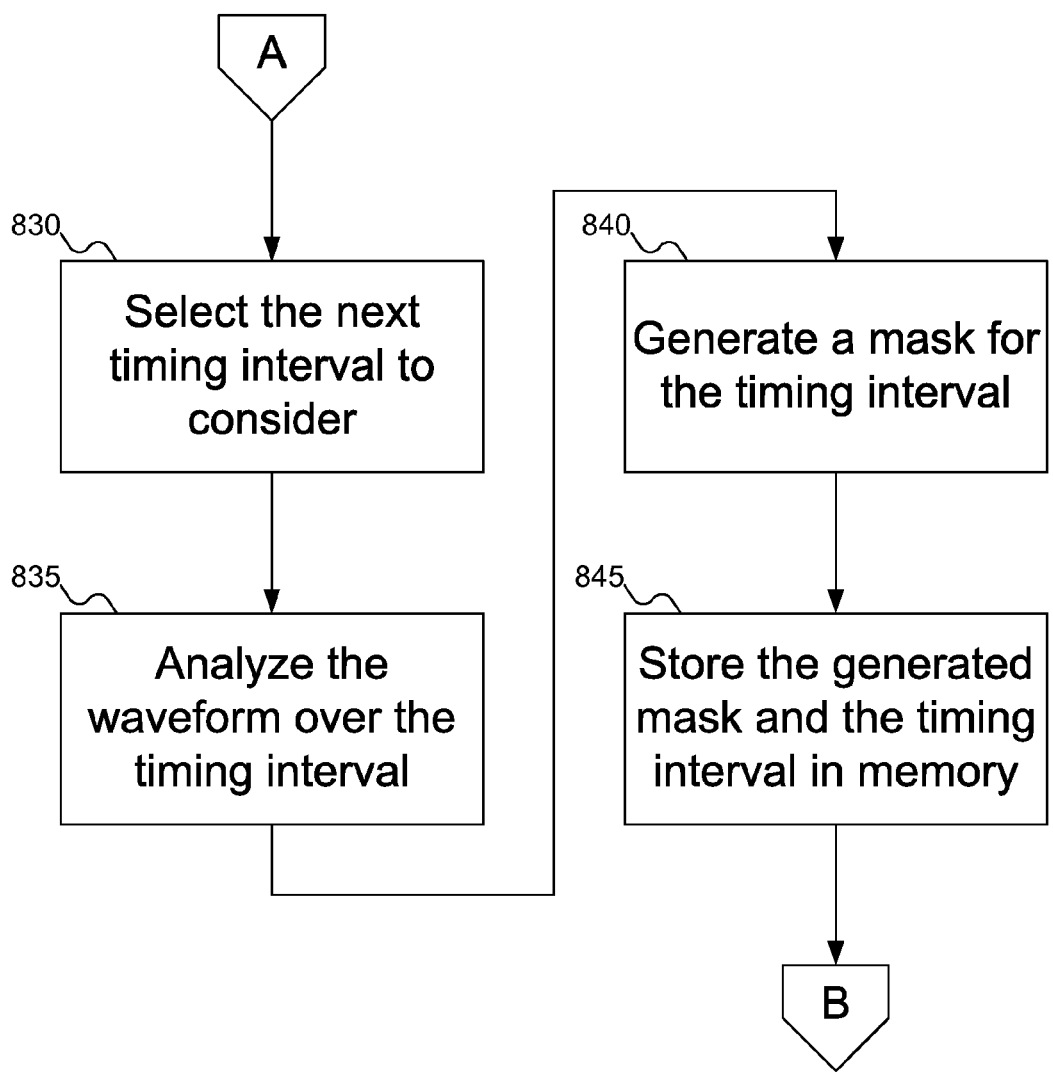

As described above, embodiments of the invention support automatic generation of the boundary masks from a waveform known to be valid. FIGS. 8A-8B show a flowchart of a procedure for generating dynamic masks from a known valid waveform, according to an embodiment of the invention. In FIG. 8A, at block 805, a trigger event is identified. This trigger event can be a trigger event that precedes a periodic form of the waveform. The identification of the trigger event can be either manual or automatic: that is, a user can manually define what the trigger event is, or the device can scan the waveform acquisitions and automatically identify a trigger event that precedes the periodic form of the waveform. At block 810, the device receives the waveform known to be valid. At block 815, the system waits for the trigger event to occur. Once the trigger event has occurred, at block 820 the device determines the timing intervals: for example, by receiving them from the user. At block 825, the device determines if there are still timing intervals to consider. If not, then processing is complete.

Otherwise, if there are still timing intervals to consider, then at block 830 (FIG. 8B), the device selects the next timing interval to consider. At block 835, the device analyzes the waveform over the timing interval. At block 840, the device generates a boundary mask for the waveform over the timing interval. At block 845, the device stores the generated boundary mask and its associated timing interval in memory. Control then returns to block 825 (FIG. 8A) to consider another timing interval.

The flowcharts described above represent various possible embodiments of the invention. Embodiments of the invention are not limited to those shown in the flowcharts. Various blocks can be omitted, and the order of blocks can be rearranged, without loss of generality to embodiments of the invention. For example, in FIG. 8A, if the device is responsible for automatically identifying the initial trigger event in block 805, the device would have to have already received the waveform, in which case block 810 would need to precede block 805.

The following discussion is intended to provide a brief, general description of a suitable machine in which certain aspects of the invention may be implemented. Typically, the machine includes a system bus to which is attached processors, memory, e.g., random access memory (RAM), readonly memory (ROM), or other state preserving medium, storage devices, a video interface, and input/output interface ports. The machine may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, or a system of communicatively coupled machines or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine may include embedded controllers, such as programmable or non-programmable logic devices or arrays, Application Specific Integrated Circuits, embedded computers, smart cards, and the like. The machine may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciated that network communication may utilize various wired and/or wireless short range or long range carriers and protocols, including radio frequency (RF), satellite, microwave, Institute of Electrical and Electronics Engineers (IEEE) 810.11, Bluetooth, optical, infrared, cable, laser, etc.

The invention may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Having described and illustrated the principles of the invention with reference to illustrated embodiments, it will be recognized that the illustrated embodiments may be modified in arrangement and detail without departing from such principles. And, though the foregoing discussion has focused on particular embodiments, other configurations are contemplated. In particular, even though expressions such as "in one embodiment" or the like are used herein, these phrases are meant to generally reference embodiment possibilities, and are not intended to limit the invention to particular embodiment configurations. As used herein, these terms may reference the same or different embodiments that are combinable into other embodiments.

What is claimed is:

1. A system, comprising:
   an analog-to-digital converter (ADC) configured to receive and digitize a waveform;
   a memory configured to store a plurality of masks; and
   a processor configured to:
   select a first mask from the plurality of masks, wherein the first mask is associated with a first timing interval,
   apply the first mask to the digitized waveform until the first timing interval has passed to determine conformance of the digitized waveform with the first mask;
   detect that the first timing interval has passed;
   in response to detecting that the first timing interval has passed, select a second mask from the plurality of masks, wherein the second mask is associated with a second timing interval;
   apply the second mask to the digitized waveform in accordance with the second timing interval to determine conformance of the digitized waveform with the second mask; and
   perform one or more actions in response to detecting a violation of the second mask by the digitized waveform during the second timing interval.

2. A system according to claim 1, wherein the processor is further configured to:
   cyclically apply the first mask for the first timing interval followed by the second mask for the second timing interval.

3. A system according to claim 1, further comprising a rasterizer configured to:
   output a representation of the first mask in conjunction with a representation of the digitized waveform during application of the first mask to the digitized waveform; and
   output a representation of the second mask in conjunction with a representation of the digitized waveform during application of the second mask to the digitized waveform.

4. A system according to claim 1, wherein the processor is further configured to:
   detect a predefined trigger event, and wherein the selection of the first mask is in response to detection of the predefined trigger event.

5. A system according to claim 1, wherein the digitized waveform is a first digitized waveform, and wherein the processor is further configured to:
   receive a second digitized waveform that is known to be valid,
   analyze the second digitized waveform, and
   automatically generate the plurality of masks from the analysis of the second digitized waveform.

6. A system according to claim 1, wherein the first mask includes a plurality of segments that combine to define boundaries of the first mask.

7. A system according to claim 1, wherein the first timing interval is a predefined period of time, a predefined number of acquisitions of the waveform, or occurrence of a trigger event.

8. A system according to claim 1, further comprising: wherein the second timing interval is either a predefined number of acquisitions of the waveform or a trigger event.

9. A method of dynamically applying masks to a digitized waveform, comprising:
   selecting a first mask from a plurality of masks and identifying a first timing interval associated with first mask;
   applying the first mask to the digitized waveform until the first timing interval has passed to determine conformance of the digitized waveform with the first mask, wherein the digitized mask represents an amplitude of a signal over time;
   detecting that the first timing interval has passed;

in response to detecting that the first timing interval has passed, selecting a second mask from the plurality of masks and identifying a second timing interval associated with the second mask, wherein the second timing interval is different from the first timing interval;

applying the second mask to the digitized waveform until the second timing interval has passed to determine conformance of the digitized waveform with the second mask; and performing one or more actions in response to detecting a violation of the second mask by the digitized waveform during the second timing interval.

10. A method according to claim 9, wherein the first timing interval is a predefined period of time, a predefined number of acquisitions, or occurrence of a predefined trigger event.

11. A method according to claim 9, wherein selecting the first mask is in response to an occurrence of a predefined trigger event.

12. A method according to claim 9, wherein the digitized waveform is a first digitized waveform, the method further comprising:
receiving a second digitized waveform that is known to be valid;
analyzing the second digitized waveform; and
automatically generating the plurality of masks from the analysis of the second digitized waveform.

13. A method according to claim 9, further comprising:
in response to detecting that the digitized waveform violating the bounds of the first mask during the first timing interval, alerting a user about a first boundary violation of the first mask; and
in response to detecting that the digitized waveform violating the bounds of the second mask during the second timing interval, alerting a user about a second boundary violation of the second mask.

14. A method according to claim 9, further comprising:
detecting that the second timing interval has passed;
in response to detecting that the second timing interval has passed, selecting a third mask and identifying a third timing interval associated with third mask;
applying the third mask to the digitized waveform until the third timing interval has passed to determine conformance of the digitized waveform with the third mask.

15. A method according to claim 9, further comprising:
cyclically applying the first mask for the first timing interval followed by the second mask for the second timing interval.

16. A method according to claim 9, further comprising:
during the first timing interval, displaying the digitized waveform and the first mask on the display; and
during the second timing interval, displaying the digitized waveform and the second mask on the display.

17. A method according to claim 9, further comprising:
receiving a digitized training waveform that is identified by a user as being a valid waveform;
analyzing the digitized training waveform for variations of the digitized training waveform over time, and
automatically generating the plurality of masks from the analysis and corresponding timing intervals, wherein the plurality of masks reflect the variations in the waveform over time, and wherein the plurality of masks include the first mask and the second mask and the corresponding timing intervals include the first timing interval and the second timing interval.

18. A method according to claim 17, further comprising: detecting an occurrence of a trigger event, wherein analyzing the digitized training waveform occurs in response to detecting the trigger event.

19. A method according to claim 17, wherein analyzing the digitized training waveform for variations of the digitized training waveform over time is based on a plurality of consecutive timing intervals that are defined by a user.

* * * * *